(12) United States Patent
Hsiao et al.

(10) Patent No.: US 9,521,795 B2
(45) Date of Patent: Dec. 13, 2016

(54) TWO-STEP DIRECT BONDING PROCESSES AND TOOLS FOR PERFORMING THE SAME

(71) Applicant: Taiwan Semiconductor Manufacturing Company, Ltd., Hsin-Chu (TW)

(72) Inventors: Yi-Li Hsiao, Hsin-Chu (TW); Da-Yuan Shih, Hsin-Chu (TW); Chih-Hang Tung, Hsin-Chu (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 12 days.

(21) Appl. No.: 13/866,858

(22) Filed: Apr. 19, 2013

(65) Prior Publication Data

US 2014/0263583 A1   Sep. 18, 2014

Related U.S. Application Data

(60) Provisional application No. 61/778,277, filed on Mar. 12, 2013.

(51) Int. Cl.
| | |
|---|---|
| *B23K 31/00* | (2006.01) |
| *B23K 31/02* | (2006.01) |
| *H05K 13/04* | (2006.01) |
| *H01L 23/00* | (2006.01) |

(52) U.S. Cl.
CPC .......... *H05K 13/0465* (2013.01); *H01L 24/75* (2013.01); *H01L 24/81* (2013.01); *H01L 24/97* (2013.01); *H01L 2224/13124* (2013.01); *H01L 2224/13144* (2013.01); *H01L 2224/13147* (2013.01); *H01L 2224/13155* (2013.01); *H01L 2224/13164* (2013.01); *H01L 2224/16225* (2013.01); *H01L 2224/16227* (2013.01); *H01L 2224/757* (2013.01); *H01L 2224/7598* (2013.01); *H01L 2224/75102* (2013.01); *H01L 2224/75251* (2013.01); *H01L 2224/75703* (2013.01); *H01L 2224/75985* (2013.01); *H01L 2224/75987* (2013.01); *H01L 2224/75988* (2013.01); *H01L 2224/8109* (2013.01); *H01L 2224/81065* (2013.01); *H01L 2224/81093* (2013.01); *H01L 2224/81193* (2013.01); *H01L 2224/81203* (2013.01); *H01L 2224/97* (2013.01)

(58) Field of Classification Search
CPC ............ H01L 2224/97; B23K 2201/42; B23K 2201/40; B23K 3/087; B30B 15/067; B30B 7/02
USPC ................................. 228/227, 228
See application file for complete search history.

(56) References Cited

U.S. PATENT DOCUMENTS

| | | | |
|---|---|---|---|
| 5,526,974 A * | 6/1996 | Gordon et al. ............... | 228/103 |
| 6,281,032 B1 * | 8/2001 | Matsuda et al. ............... | 438/42 |
| 7,642,129 B2 | 1/2010 | Liang et al. | |

(Continued)

*Primary Examiner* — Erin Saad
(74) *Attorney, Agent, or Firm* — Slater Matsil, LLP

(57) ABSTRACT

A method includes placing a plurality of first package components over second package components, which are included in a third package component. First metal connectors in the first package components are aligned to respective second metal connectors of the second package components. After the plurality of first package components is placed, a metal-to-metal bonding is performed to bond the first metal connectors to the second metal connectors.

20 Claims, 9 Drawing Sheets

(56) References Cited

U.S. PATENT DOCUMENTS

| | | | |
|---|---|---|---|
| 2002/0020309 A1* | 2/2002 | Kono | 100/325 |
| 2002/0086515 A1* | 7/2002 | Fukuyama | 438/616 |
| 2010/0024667 A1* | 2/2010 | Ikura | 100/38 |
| 2010/0225011 A1 | 9/2010 | Lee et al. | |
| 2012/0111922 A1* | 5/2012 | Hwang et al. | 228/6.2 |
| 2012/0252189 A1* | 10/2012 | Sadaka | H01L 24/05 438/455 |
| 2014/0077360 A1* | 3/2014 | Lin et al. | 257/737 |

* cited by examiner

TWO-STEP DIRECT BONDING PROCESSES AND TOOLS FOR PERFORMING THE SAME

This application claims the benefit of the following provisionally filed U.S. patent Application Ser. No. 61/778,277, filed Mar. 12, 2013, and entitled "Two-Step Direct Bonding Processes and Tools for Performing the Same," which application is hereby incorporated herein by reference.

BACKGROUND

Direct bonding is a commonly used bonding method in the manufacturing of integrated circuits. In the direct bonding, two metal bumps are bonded together without solder disposed in between. For example, the direct bonding may be a copper-to-copper bonding or a gold-to-gold bonding. The methods for performing the direct bonding include Thermal Compression Bonding (TCB, sometimes known as thermal compressive bonding). In a direct bonding process, the metal bumps of a device die is aligned to, and placed against, the metal bumps of a package substrate. A pressure is applied to press the device die and the package substrate against each other. During the bonding process, the device die and the package substrate are also heated. With the pressure and the elevated temperature, the surface portions of the metal bumps of the device die and the package substrate inter-diffuse, so that bonds are formed. Solder layer with thickness less than 3 μm may be added to each side of the metal bumps of the device die and the package substrate as the top portions of the respective metal bumps. In the direct bonding, the solder layers are in contact with each other, and are bonded with the underlying non-flowable portion of the metal bumps.

To allow the inter-diffusion to occur, the direct bonding is usually a lengthy process, sometimes taking hours or days to finish. The throughput of the direct bonding is thus low.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

Methods for performing direct bonding and the respective tools are provided in accordance with some exemplary embodiments. The intermediate stages in the bonding process are provided. Variations of the embodiments are discussed. Throughout the various views and illustrative embodiments, like reference numbers are used to designate like elements.

Figure 1:
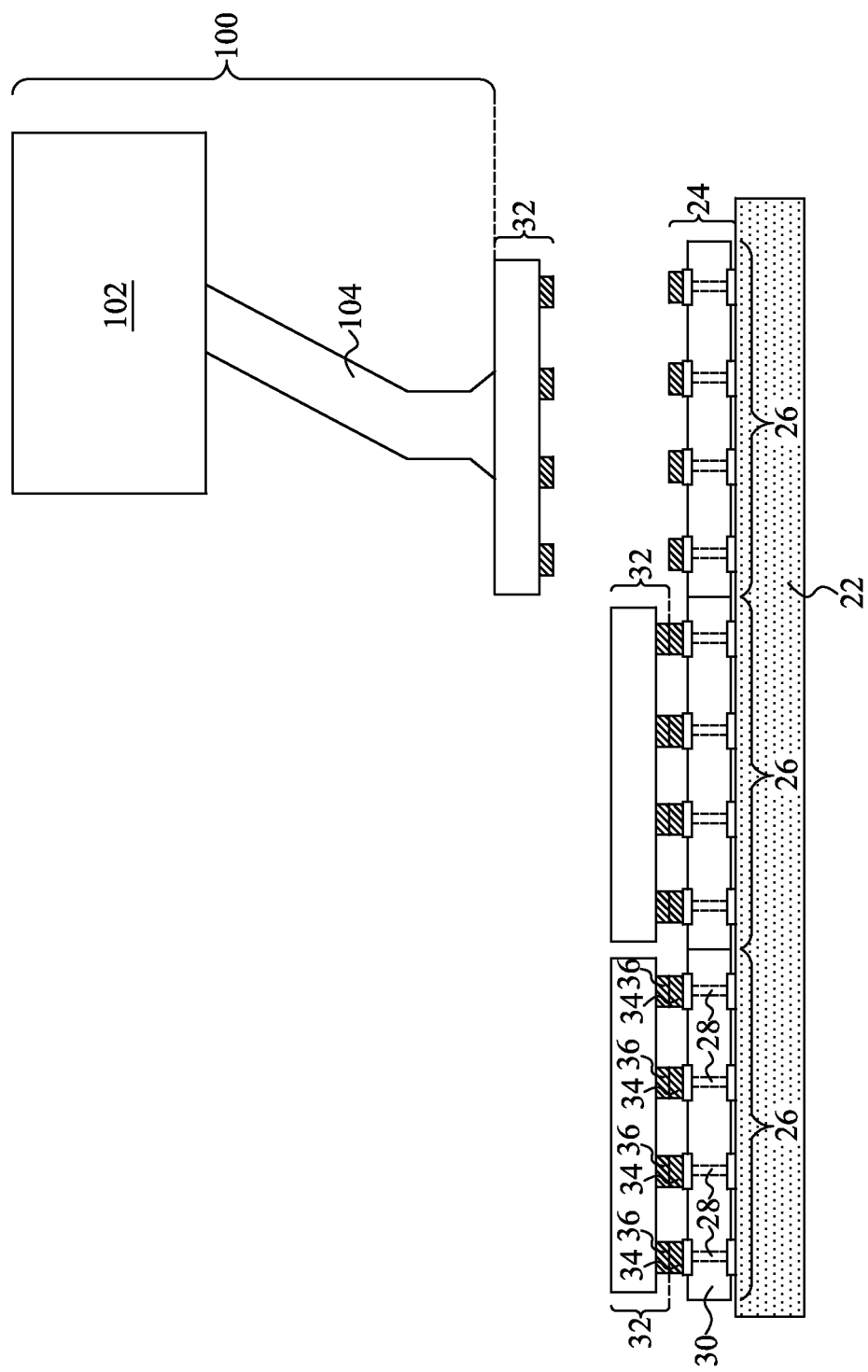
FIGS. 1 through 3 are cross-sectional views of intermediate stages in the formation of a jig assembly stack in accordance with some exemplary embodiments.
Figure 2:
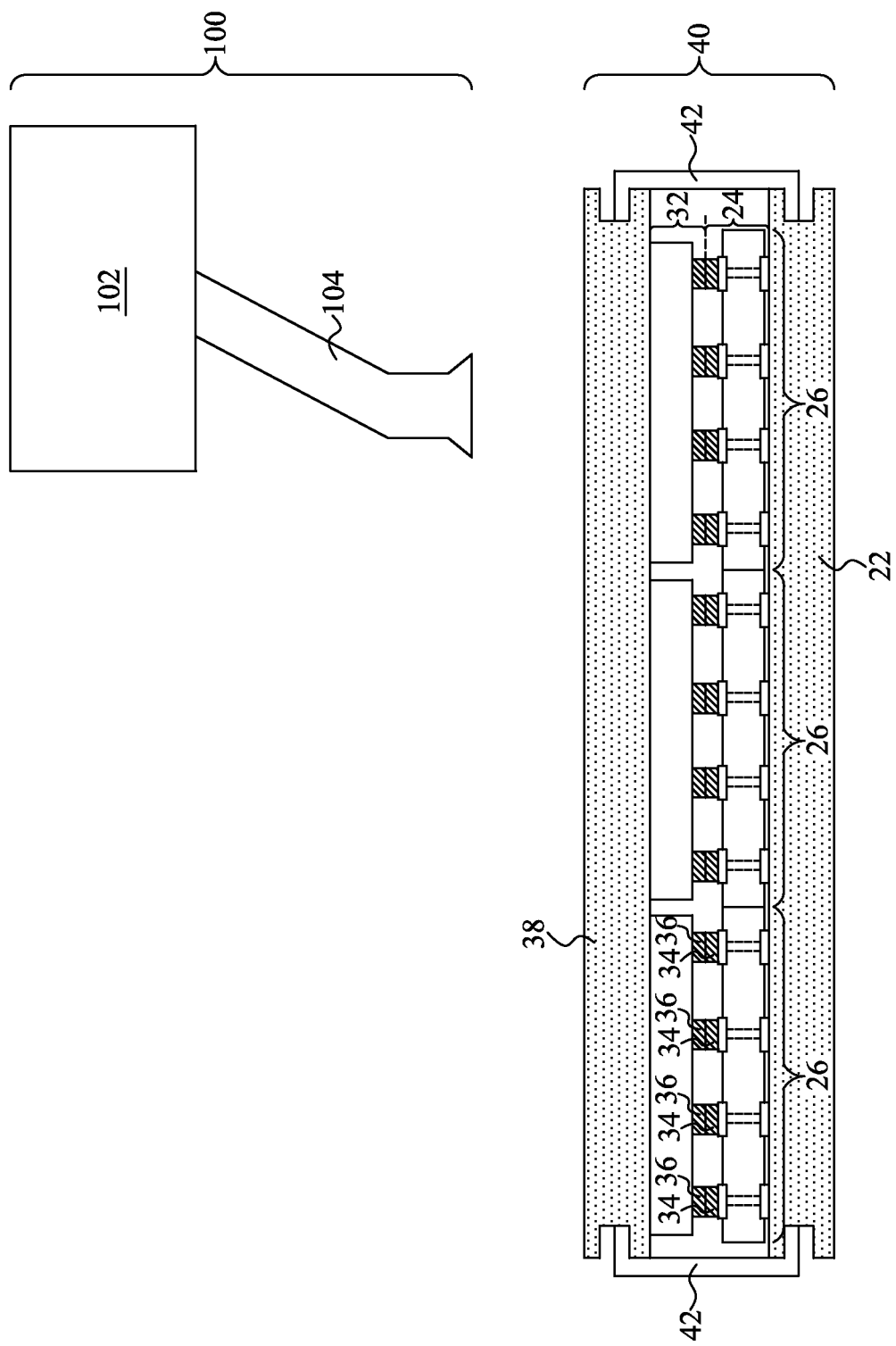
Figure 3:
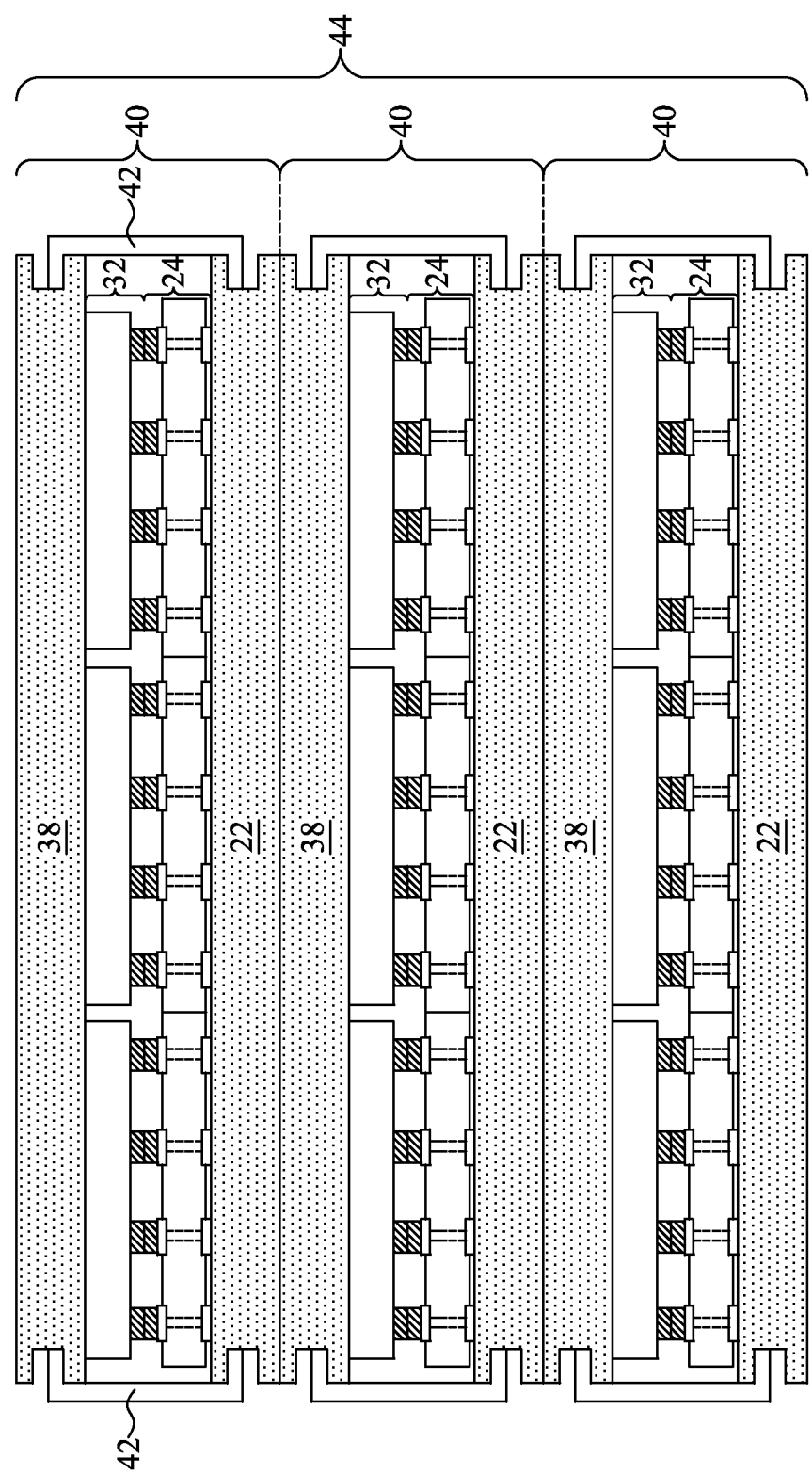

FIG. 1 schematically illustrates pick-and-place tool 100, which is configured to pickup and place a plurality of components, and assemble the components into jig assemblies. In some embodiments, pick-and-place tool 100 includes control unit 102, and a plurality of pickup heads. FIG. 1 schematically illustrates pickup head 104 to represent the plurality of pickup heads, which is controlled by control unit 102 to perform the respective tasks, including picking up, placing, and stacking a plurality of different components that are shown in FIGS. 1 through 3.

FIG. 1 also illustrates the pick-and-place of bottom jig 22, bottom package component 24 over bottom jig 22, and top package components 32 over bottom package component 24. In some embodiments, bottom jig 22 comprises a plate having a planar top surface, on which bottom package component 24 is placed. Bottom jig 22 may be formed of ceramic, stainless steel, aluminum, copper, alloys thereof, or the like. Bottom package component 24 may be a package substrate strip, although bottom package component 24 may be another type of package component such as an interposer wafer, a packaged wafer, a device wafer, or the like. Package components 26, which are comprised in bottom package component 24, may be package substrates 26, although they may be other types of package components. Package components 26 may be identical to each other. In some embodiments, package components 26 are laminate package substrates, wherein conductive traces 28 (which are schematically illustrated) are embedded in laminate dielectric layers 30. In alternative embodiments, package components 26 are built-up package substrates which comprise cores (not shown), and conductive traces (not shown) built on opposite sides of the cores. The conductive traces are interconnected through conductive features in the core.

Top package components 32 may be device dies, which may include active devices such as transistors (not shown) therein. In alternative embodiments, top package components 32 are interposers, packages, or the like. Bottom package components 26 include metal connectors 34. Top package components 32 include metal connectors 36. Metal connectors 34 and 36 may be free from solders or with thinner solder surface, which have thickness less than about 3 μm. In accordance with some embodiments. The metals in metal connectors 34 and 36 may include a metal or a metal alloy selected from copper, gold, nickel, palladium, aluminum, and combinations thereof.

Pick-and-place tool 100 is configured to use the pickup heads 104 to pickup and place bottom jig 22, bottom package component 24 over and aligned to bottom jig 22, and top package components 32 aligned to the respective bottom package components 26. Furthermore, pick-and-place tool 100 controls the alignment of metal connectors 36 to the respective metal connectors 34, so that metal connectors 34 and 36 may be aligned one-to-one accurately. The pick-and-place of top package components 32 may be performed one-by-one, during which time bottom jig 22, bottom package component 24, and the already placed top package components 32 are not heated. Accordingly, the pick-and-place of top package components 32 onto bottom package components 26 are fast, for example, with from a half second to several seconds needed for picking up and placing one top package component 32.

Referring to FIG. 2, after the alignment and the placement of all top package components 32, top jig 38 is placed over, and aligned to package components 32 and bottom jig 22. It is appreciated that FIGS. 1 and 2 illustrate simplified views of top jig 38, and the details of top jig 38 may be found referring to FIGS. 6 through 9C. The pick-and-place of top jig 38 may also be performed by pick-and-place tool 100. Bottom jig 22, top jig 38, and package components 24 and 32 therebetween are then secured through a securing mechanism to form jig assembly 40. In some embodiments, the securing of jig assembly 40 is through a plurality of clamps 42, which may be distributed on the edges of bottom jig 22 and top jig 38. The securing mechanism holds bottom jig 22, top jig 38, and package components 24 and 32 together as an integrated unit, so that metal connectors 34 and 36 remain aligned in subsequent bonding steps.

FIG. 3 illustrates the formation and the assembly of more jig assemblies 40. In some embodiments, a plurality of jig assemblies 40 are assembled first, and then the assembled jig assemblies 40 are stacked. Clamps 42 are used to secure the stacked jig assemblies 40. Throughout the description, the stacked jig assemblies 40 in combination are referred to as jig assembly stack 44 hereinafter. In subsequent description, when "jig assembly stack 44" is referred to, it may indicate a plurality of jig assemblies 40 stacked together, or may also refer to a single jig assembly 40, with no additional jig assemblies 40 stacked thereon.

Figure 4:
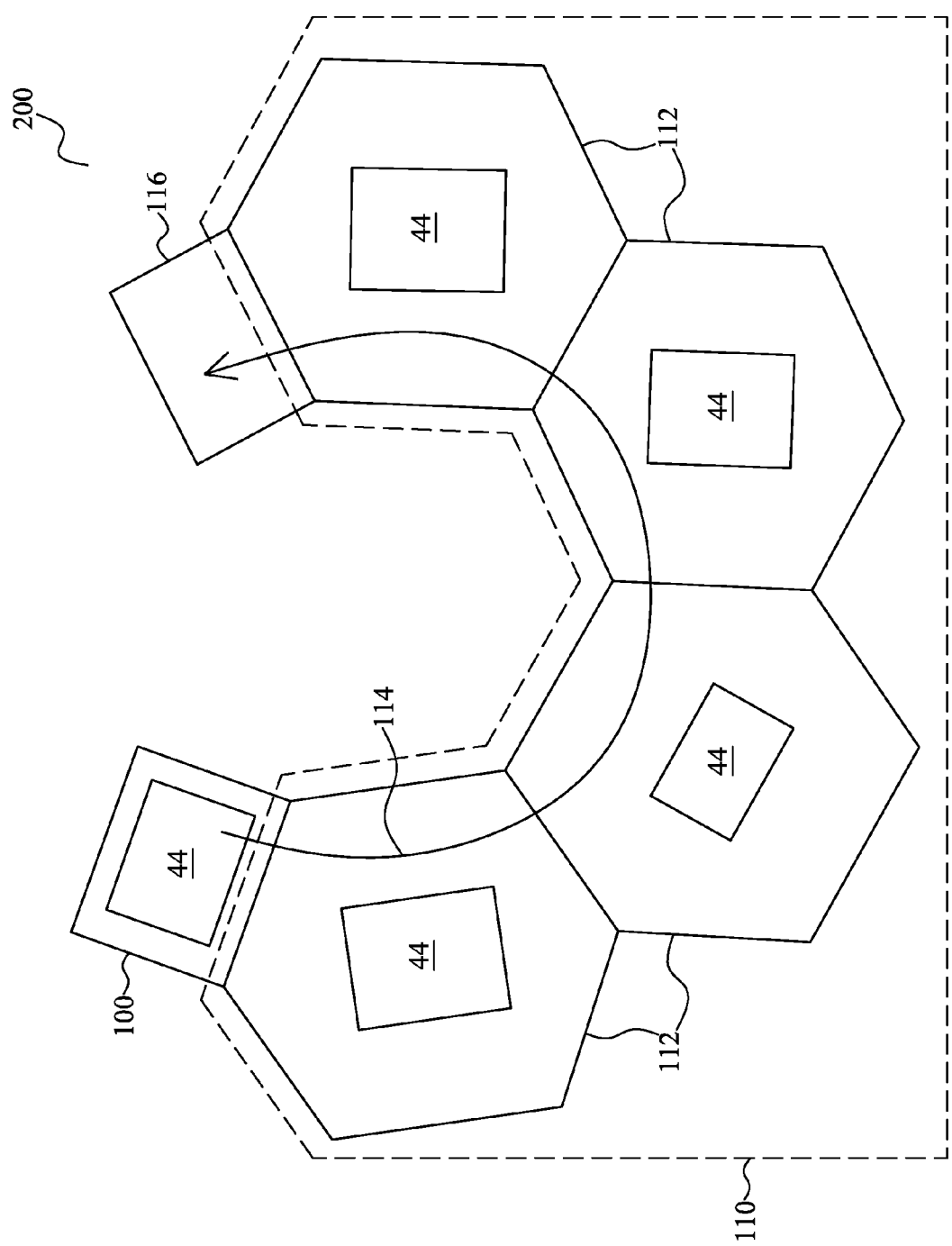
FIG. 4 illustrates a bonding tool for performing a direction bonding on the jig assembly stack in accordance with some exemplary embodiments.

FIG. 4 illustrates a schematic view of bonding tool 200 used for the direct bonding. In accordance with some embodiments, bonding tool 200 includes pick-and-place tool 100, and bonding tool 110 for performing the direct bonding on jig assembly stack 44. In some embodiments, pick-and-place tool 100 and bonding tool 110 are integrated together as an integrated platform, wherein the actions of pick-and-place tool 100 and bonding tool 110 may be synchronized, and controlled by a common control unit (not shown). In alternative embodiments, pick-and-place tool 100 and bonding tool 110 are separate tools, which may be placed together or placed apart from each other. Bonding tool 110 may include one or a plurality of chambers 112. Chambers 112 include at least one chamber (and sometimes more chambers) that has the ambient pressure control (vacuum control), thermo control for heating jig assembly stack 44, gas flow control, and pressing-force control for pressing metal connectors 34 and 36 (FIG. 1) against each other. Chambers 112 may also include other chambers for performing additional tasks that may be needed for jig assembly stack 44, which tasks includes, and are not limited to, the reduction of the oxides that are undesirably formed on the surfaces of metal connectors 34 and 36 (FIG. 1). With multiple chambers 112, different tasks of the direct bonding process may be performed sequentially when jig assembly stack 44 is transported from chamber-to-chamber among chambers 112, for example, in the direction of arrow 114. With the multi-chamber design, the cost of the production tool may be reduced. For example, the multiple chambers 112 may share the common loading/unloading tool 116, which is used for load and/or unload jig assembly stack 44.

Figure 5:
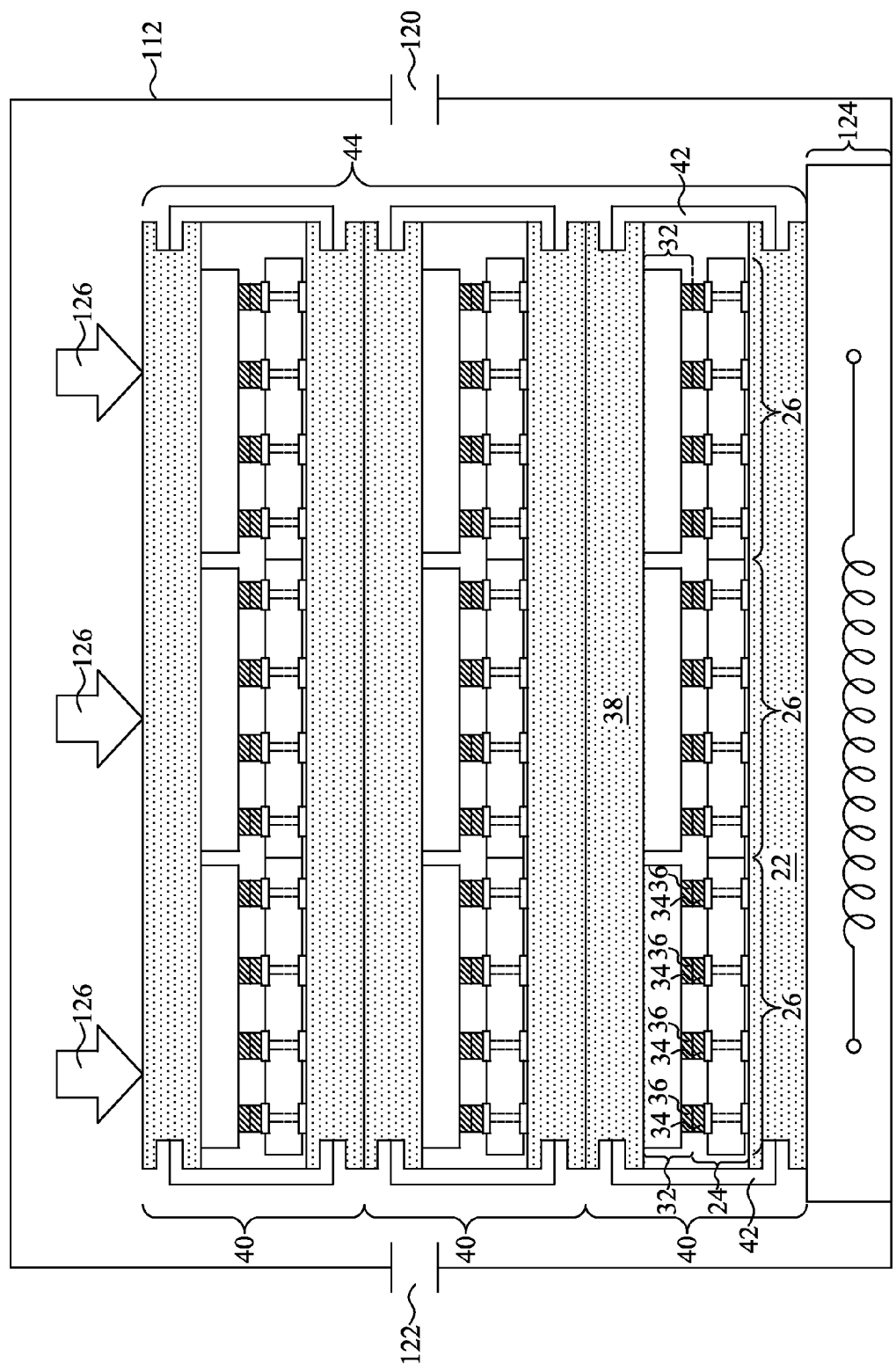
FIG. 5 illustrates a direct bonding process in accordance with some exemplary embodiments.

FIG. 5 illustrates a bonding process performed in one of chambers 112 in accordance with exemplary embodiments. Chamber 112 is configured to be vacuumed, for example, through outlet 120, which is connected to a pump (not shown), for example. Process gases such as a forming gas (such as $N_2$, Ar, He, and hydrogen mixed, for example) may be introduced into chamber 112 through inlet 122. The reduction gas is used for reducing the oxide formed on the surfaces of connectors 34 and 36 during the bonding process. Chamber 112 is further configured to maintain the internal pressure in chamber 112 within a desirable range. Furthermore, chamber 112 may include heater 124 which may be used for heating jig assembly stack 44 during the bonding process. Pressing force 126 may be applied on jig assembly stack 44 to press metal connectors 34 and 36 against each other throughout the bonding process. In some exemplary embodiments, during the bonding process, pressing force 126 may be about 0.5 Newton/die to about 500 Newton/die, depending on the die size and the bump density. The temperature of jig assembly stack 44 may be between about 120° C. and about 470° C., and the bonding time may be between about 30 seconds and about 55 hours. After the bonding process, package components 32 are bonded to the underlying package components 26, with metal connectors 36 bonded to the respective underlying metal connectors 34 through metal-to-metal bonding. Jig assembly stack 44 may then be unloaded from bond tool 200 (FIG. 4), for example, through loading/unloading tool 116 in FIG. 4.

Figure 6:
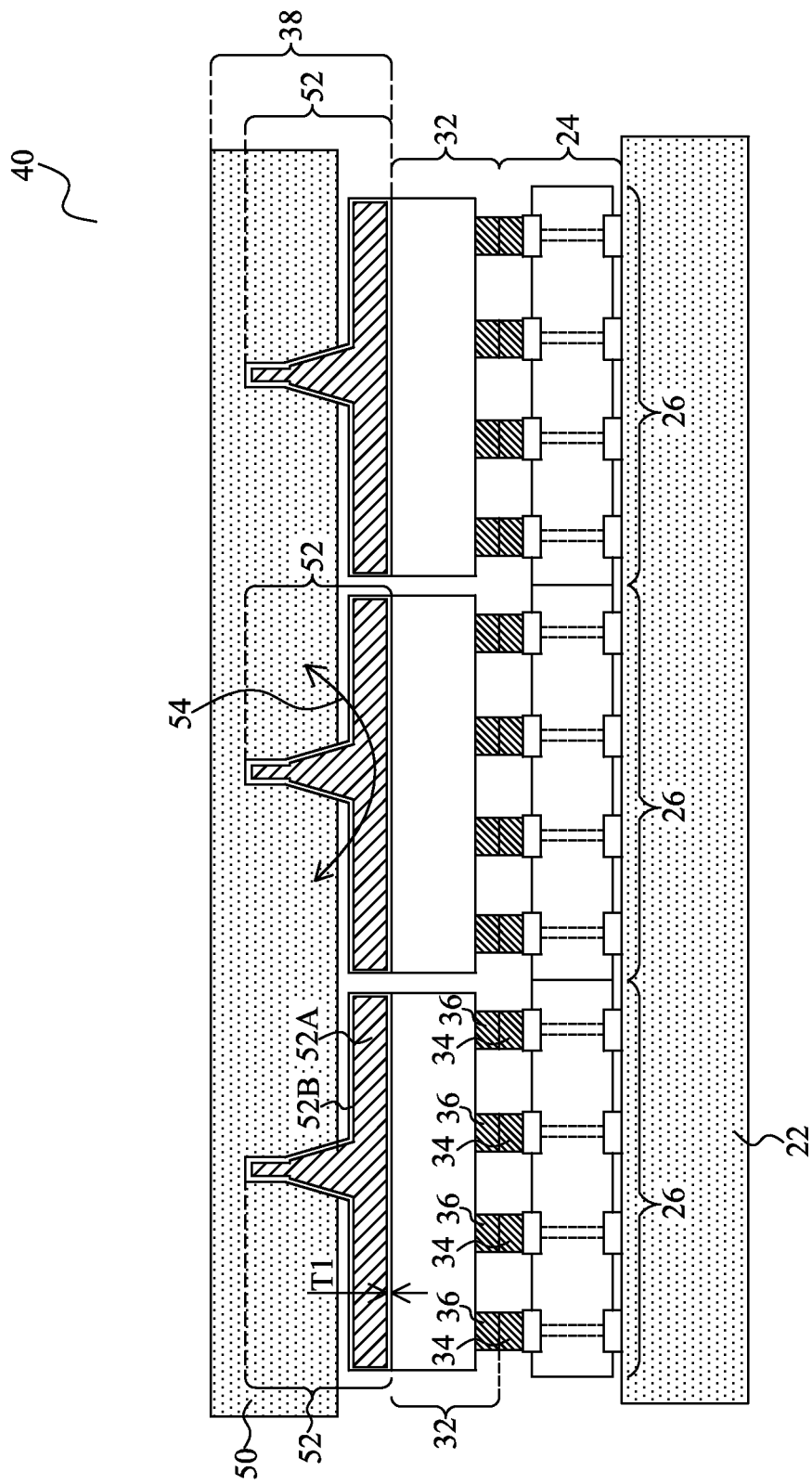
FIGS. 6 through 9C are various designs of top jigs in accordance with some exemplary embodiments.

FIGS. 6 through 9C illustrate the details of exemplary top jigs 38 in accordance with some exemplary embodiments. Referring to FIG. 6, top jig 38 includes base plate 50 and landing units 52 attached to base plate 50. Base plate 50 may comprise a rigid material, which may be selected from copper, stainless steel, ceramic, aluminum, and alloys thereof, for example. Base plate 50 includes a plurality of holes for plugging the ends of landing units 52 therein. In some embodiments, landing units 52 include rigid inner portions 52A, and elastic outer portions 52B coated on the surfaces of inner portions 52A. Each of landing units 52 may include a narrow portion that is inserted into base plate 50, and a wide portion outside of base plate 50. The narrow portion may have a part that has gradually reduced widths so that base plate 50 may be inserted into base plate 50. Furthermore, the wide portion may have a flat bottom surface that is used to land on package component 32.

Inner portions 52A may be formed of a material selected form the same group of candidate materials used for forming base plate 50, although other materials may be used. Elastic outer portions 52B is more elastic than portions 52A, and may be formed of silicone based materials, for example. The thickness T1 of outer portions 52B may be between about 0.2 μm and about 10 μm, or between about 0.5 μm and 5 μm. Elastic outer portions 52B may be coated on the entire surface of rigid portions 52A before landing units 52 are plugged into base plate 50. Accordingly, elastic outer portions 52B separate rigid portions 52A from base plate 50.

The use of elastic outer portions 52B may help the securing of landing units 52 in the respective holes in base plate 50. Furthermore, it is realized that the top surfaces of top package components 32 have variations, and are not at exactly the same level. As a result, if a rigid and flat top jig is used, the package components 32 whose top surfaces are higher than others may receive more pressing force than others. This may cause the breakage of these package components 32 and/or inferior bonding of those package components 32 whose top surfaces are low. With the elastic outer portions 52B, the bonding force applied on top package components 32 are automatically adjusted to be more uniform. In addition, due to the existence of elastic outer portions 52B in the holes of base plate 50, if the top surfaces of package components 32 are tilted slightly, landing units 52 may automatically adjust their surfaces to tilt (in the directions of arrow 54) slightly in response to the tilting of the top surfaces of top package components 32.

Figure 7:
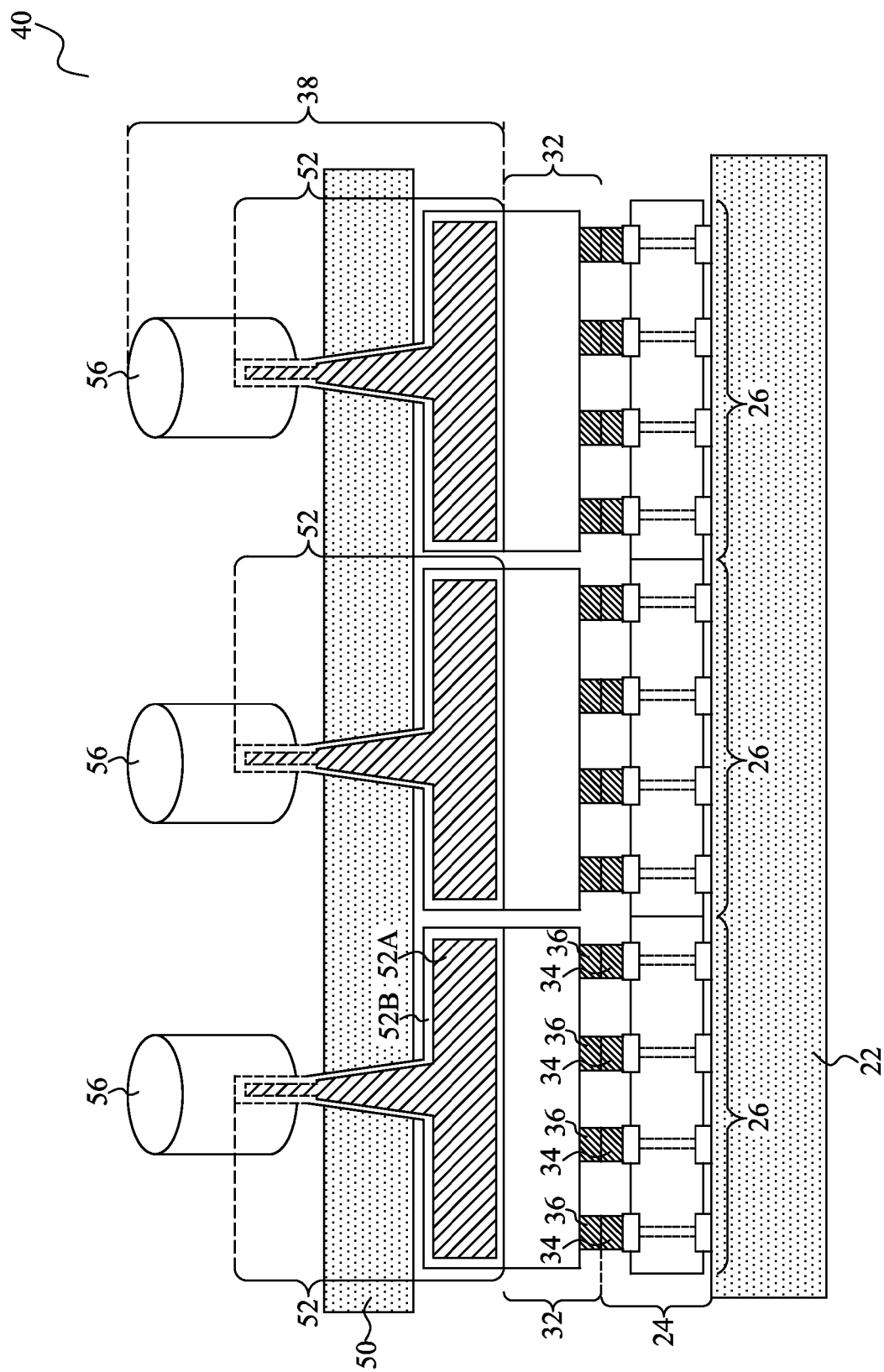
Figure 8:
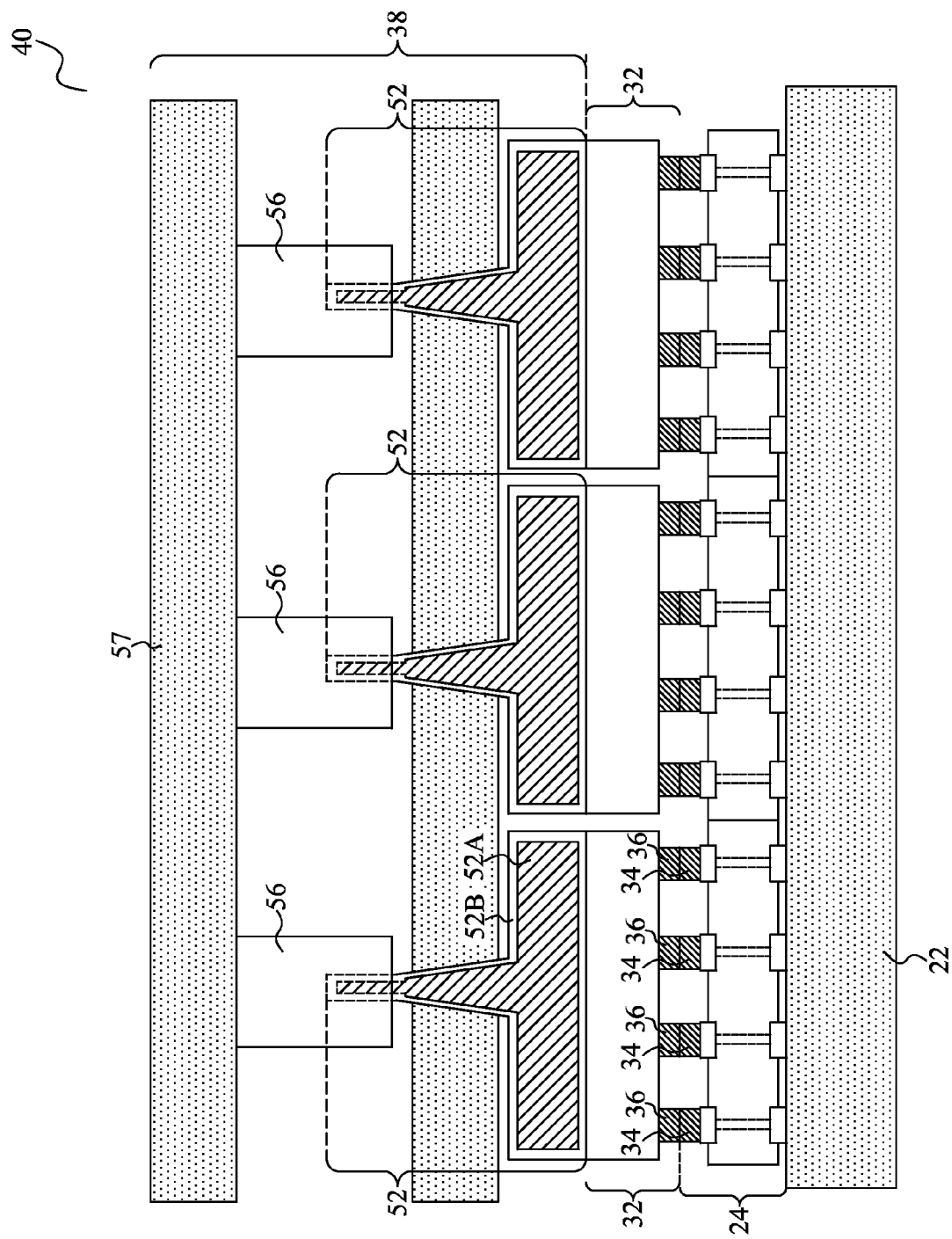

FIG. 8 illustrates top jig 38 in accordance with alternative embodiments. Landing units 52 in these embodiments are similar to what are in FIG. 6, except landing units 52 in FIG. 7 penetrate through base plate 50, with a portion of each of landing units 52 protruding out of the top surface of base plate 50. In these embodiments, the top ends of landing units 52 may be plugged into weight units 56, which have holes fitting the top end portions of landing units 52. Accordingly, each of weight units 56 may press on the respective underlying landing unit 52 individually without applying force on other landing units 52. Landing units 52 transfer the weights of the respective overlying weight units 56 to the underlying top package components 32. With the top jig 38 shown in FIG. 8, weight units 56 may have different weights, which may compensate for the difference in the pressing force received by top package components 32. Accordingly, by adjusting the weights of weight units 56 to be different from, or same as, each other, top package components 32 may receive a uniform pressing force, and the bonding is more uniform throughout all top package components 32. FIG. 8 illustrates a design similar to what is shown in FIG. 7. In addition to what are illustrated in FIG. 7, plate 57 is further placed over weight units 56. The weight of plate 57 is also applied on package components 32 through weight units 56.

Figure 9A:
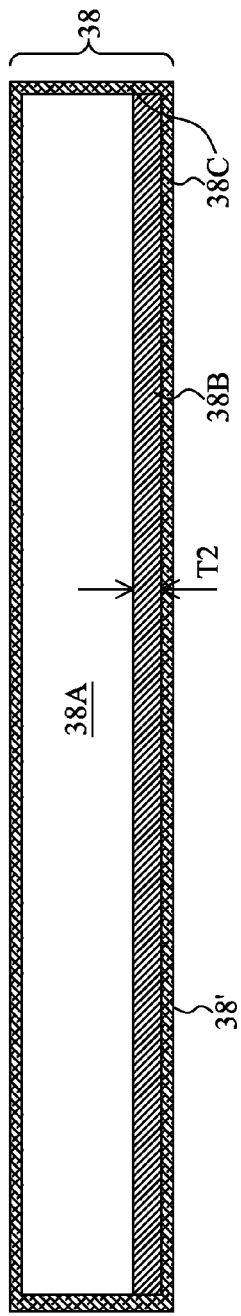
Figure 9B:
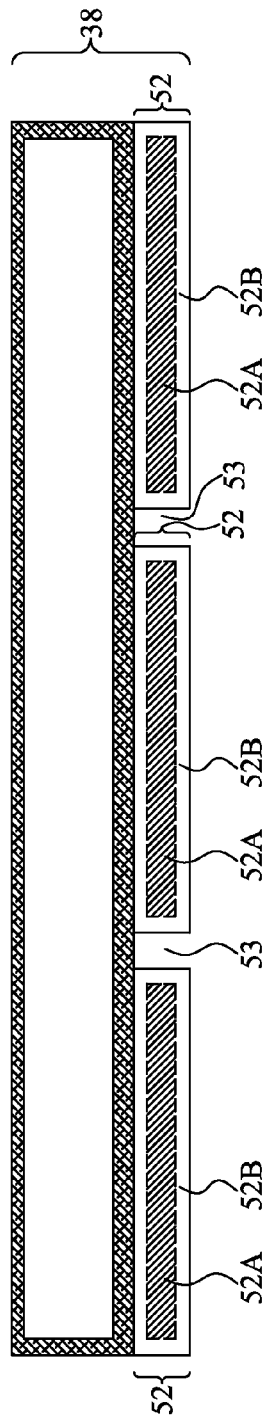
Figure 9C:
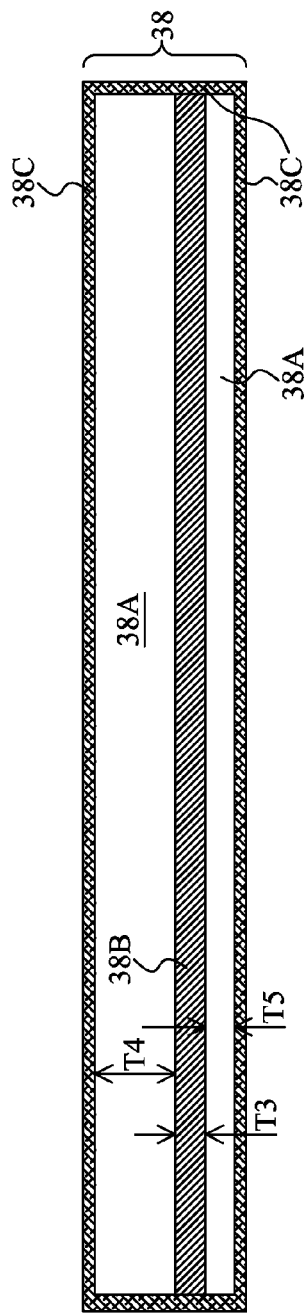

FIGS. 9A, 9B, and 9C illustrate top jig 38 having various designs. Referring to FIG. 9A, top jig 38 includes rigid base plate 38A, elastic layer 38B, and coating 38C. Base plate 38A may be formed of a rigid material similar to the materials of base plate 50 in FIG. 6. Elastic layer 38B is more elastic than base plate 38A, and may comprise silicone, for example, although other elastic materials may also be used. Thickness T2 of elastic layer 38B may be between about 0.5 µm and about 30 µm, or between about 1 µm and 5 µm. The outer coating 38C may be formed of Polytetrafluoroethylene (PTFE, known as Teflon, a registered trademark of DuPont Corporation) as an example. With the elastic layer 38B, the force applied on top package components 32 (FIG. 5) by top jig 38 are automatically adjusted, and hence is more uniform. In the bonding process, surface 38' is in contact with package components 32 in FIG. 5.

FIG. 9B illustrates top jig 38 in accordance with alternative embodiments. In these embodiments, there is a plurality of landing units 52 formed as the bottom portions of top jig 38. Each of the landing units 52 may be aligned to one of package components 32 in the direct bonding process. Spaces 53 are formed between landing units 52 and separating landing units 52 from each other. The positions of landing units 52 may be arranged as an array in a bottom view of top jig 38. In some embodiments, each of landing units 52 is formed of a homogeneous material such as silicone, Teflon, or another elastic material. In alternative embodiments, each of landing units 52 has a heterogeneous structure including core 52A and coating 52B on the surfaces of core 52A. One of core 52A and coating 52B may be formed of a material more elastic than the other. For example, core 52A may be formed of a rigid material such as copper, stainless steel, ceramic, aluminum, or alloys thereof, while coating 52B may be formed of an elastic material with a high thermal conductivity such as silicone or/and Teflon. Alternatively, coating 52B is formed of a rigid material such as copper, stainless steel, ceramic, aluminum, or alloys thereof, while core 52A may be formed of an elastic material such as silicone or Teflon.

FIG. 9C illustrates top jig 38 in accordance with alternative embodiments, these embodiments are similar to the embodiments in FIG. 9A, except that elastic layer 38B is sandwiched between two rigid base plates 38A. Thickness T3 in these embodiments may be greater than thickness T2 in FIG. 9A, and may be between about 1 µm and about 50 µm, for example. The portion of rigid base plate 38A over elastic layer 38B has thickness T4, and the portion of rigid base plate 38A underlying elastic layer 38B has thickness T5 smaller than thickness T4. In some embodiments, the ratio T5/T4 is smaller than about 0.1. With thickness T5 being small, it is easier for elastic layer 38B to absorb the force from the underlying package components 32 (not shown) in the direct bonding process.

In the embodiments of the present disclosure, the throughput of the direct bonding process is significantly improved. Although the bonding time is long, since there are multiple package components 24 and the corresponding package components 32 (FIG. 5) bonded at the same time, the overall throughout is high. Furthermore, since the heating is performed after all package components 32 have been placed on package component 24, and all package components are heated simultaneously, the undesirable heating suffered by package components that are not being bonded in the conventional direct bonding process is avoided.

In accordance with some embodiments, a method includes placing a plurality of first package components over second package components, which are included in a third package component. First metal connectors in the first package components are aligned to respective second metal connectors of the second package components. After the plurality of first package components is placed, a metal-to-metal bonding is performed to bond the first metal connectors to the second metal connectors.

In accordance with other embodiments, a method includes placing a bottom jig, and placing a first package component over the bottom jig, wherein the first package component includes a plurality of second package components therein. A plurality of third package components is placed over the plurality of second package components. A top jig is placed over the plurality of third package component. The top jig, the bottom jig, the first package component, and the plurality of third package components are secured together to form a jig assembly. A metal-to-metal bonding is then performed on the jig assembly.

In accordance with yet other embodiments, an apparatus includes at least one pickup head, which is configured to pickup and place a bottom jig assembly, pickup and place a first package component over the bottom jig, wherein the first package component comprises a plurality of second package components therein, pickup and place a plurality of third package components over the plurality of first package components, pickup and place a top jig over the plurality of third package components, and secure the top jig, the bottom jig, the first package component, and the plurality of third package components together to form a jig assembly. The apparatus further includes a control unit connected to, and configured to control, the at least one pickup head.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   placing a package component group over a bottom jig, wherein the package component group comprises a plurality of first package components, with neighboring ones of the plurality of first package components contact with each other to form the package component group;
   placing a plurality of second package components over the plurality of first package components, wherein the plurality of first package components and the plurality of second package components in combination form a modified package component group, wherein first metal connectors in the plurality of first package components are aligned to respective second metal connectors of the plurality of second package components;
   placing a top jig over the plurality of first package components;
   securing the bottom jig, the top jig, and the modified package component group using a clamp to form an integrated jig assembly;
   stacking a plurality of weight units over the plurality of second package components, wherein the plurality of weight unit comprises:
      a first weight unit having a first weight; and
      a second weight unit having a second weight different from the first weight unit; and
   performing a metal-to-metal bonding on the integrated jig assembly to bond the first metal connectors to the second metal connectors, wherein each of the plurality of weight units applies a weight on respective underlying ones of the plurality of second package components individually during the metal-to-metal bonding.

2. The method of claim 1, wherein the first metal connectors and the second metal connectors are free from solder, and wherein each of the first metal connectors is in physical contact with one of the second metal connectors.

3. The method of claim 1, wherein at least one of the first metal connectors and the second metal connectors comprises solder.

4. The method of claim 1, wherein the top jig comprises landing units, and wherein the landing units are configured to tilt in response to tilted top surfaces of the respective underlying ones of the plurality of second package components.

5. The method of claim 1, wherein the first weight is applied to a first one of the plurality of second package components during the metal-to-metal bonding; and
   the second weight is applied to a second one of the plurality of second package components during the metal-to-metal bonding.

6. A method comprising:
   placing a plurality of first package components over a plurality of second package components, wherein the plurality of second package components in combination form a third package component, and neighboring ones of the plurality of second package components contact with each other, wherein first metal connectors in the first package components are aligned to respective second metal connectors of the a plurality of second package components;
   placing a top jig over the plurality of first package components, wherein the top jig comprises a plurality of landing units, each comprising an elastic coating, and wherein each of the plurality of landing units is configured to tilt in response to tilted top surfaces of the respective underlying ones of the plurality of first package components;
   stacking a plurality of weight units over the plurality of landing units; and
   performing a metal-to-metal bonding to bond the first metal connectors to the second metal connectors, wherein each of the plurality of weight units applies a weight on a respective underlying one of the plurality of first package components individually during the metal-to-metal bonding.

7. The method of claim 6, wherein the first metal connectors and the second metal connectors are free from solder, and wherein each of the first metal connectors is in physical contact with one of the second metal connectors.

8. The method of claim 6, wherein at least one of the first metal connectors and the second metal connectors comprises solder.

9. The method of claim 6 further comprising:
   before the placing the plurality of first package components, placing the third package component over a bottom jig; and
   securing the bottom jig, the top jig, the plurality of first package components, and the third package component using a clamp to form an integrated jig assembly.

10. The method of claim 6, wherein the plurality of weight unit comprises a first weight unit having a first weight, and a second weight unit having a second weight different from the first weight unit.

11. The method of claim 5, wherein the first weight and the second weight are applied simultaneously.

12. The method of claim 1, wherein the clamp comprises a first leg penetrating into the top jig, and a second leg penetrating into the bottom jig.

13. The method of claim 9, wherein the clamp comprises a first leg penetrating into the top jig, and a second leg penetrating into the bottom jig.

14. A method comprising:
    placing a package component group over a bottom jig, wherein the package component group comprises a plurality of first package components, with neighboring ones of the plurality of first package components contact with each other to form the package component group;
    placing a plurality of second package components over the plurality of first package components, wherein the plurality of first package components and the plurality of second package components in combination form a modified package component group, wherein first metal connectors in the plurality of first package components are aligned to respective second metal connectors of the plurality of second package components;
    placing a top jig over the plurality of first package components, wherein the top jig comprises landing units having elastic outer portions, and wherein the landing units are configured to tilt in response to tilted top surfaces of the respective underlying ones of the plurality of second package components;
    securing the bottom jig, the top jig, and the modified package component group using a clamp to form an integrated jig assembly;
    stacking a plurality of weight units over the plurality of second package components, wherein the plurality of weight unit comprises:
       a first weight unit having a first weight; and a second weight unit having a second weight different from the first weight unit; and performing a metal-to-metal bonding on the integrated jig assembly to bond the first metal connectors to the second metal connectors, wherein each of the plurality of weight units applies a weight on respective underlying ones of the plurality of second package components individually during the metal-to-metal bonding.

15. The method of claim 14, wherein the first metal connectors and the second metal connectors are free from solder, and wherein each of the first metal connectors is in physical contact with one of the second metal connectors.

16. The method of claim 14, wherein at least one of the first metal connectors and the second metal connectors comprises solder.

17. The method of claim 14, wherein:
the first weight is applied to a first one of the plurality of second package components during the metal-to-metal bonding; and
the second weight is applied to a second one of the plurality of second package components during the metal-to-metal bonding.

18. The method of claim 17, wherein the first weight and the second weight are applied simultaneously.

19. The method of claim 14, wherein the clamp comprises a first leg penetrating into the top jig, and a second leg penetrating into the bottom jig.

20. The method of claim 14, wherein the elastic outer portions are formed of a silicone based material.

* * * * *